United States Patent
Abe et al.

(10) Patent No.: US 6,757,195 B2
(45) Date of Patent: Jun. 29, 2004

(54) FLASH MEMORY HAVING ENHANCED YIELD AND HAVING ENHANCED RELIABILITY IN REDUNDANT AND DUMMY CIRCUITS

(75) Inventors: Toshihiro Abe, Tokyo (JP); Yoshio Kasai, Tokyo (JP); Naoki Ootani, Tokyo (JP); Mitsuru Sugita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/193,252

(22) Filed: Jul. 12, 2002

(65) Prior Publication Data

US 2003/0043626 A1 Mar. 6, 2003

(30) Foreign Application Priority Data

Aug. 28, 2001 (JP) ........................................ 2001-258124

(51) Int. Cl.[7] .............................................. G11C 16/06
(52) U.S. Cl. .............................. 365/185.09; 365/185.2; 365/185.11
(58) Field of Search ....................... 365/185.09, 185.11, 365/185.2, 185.33, 210, 200

(56) References Cited

U.S. PATENT DOCUMENTS

| | | | | | |
|---|---|---|---|---|---|
| 4,884,241 | A | * | 11/1989 | Tanake et al. | 365/185.21 |
| 5,297,079 | A | * | 3/1994 | Ha | 365/210 |
| 6,163,484 | A | * | 12/2000 | Uekubo | 365/185.2 |

\* cited by examiner

Primary Examiner—Son Mai
(74) Attorney, Agent, or Firm—Burns, Doane, Swecker & Mathis, L.L.P.

(57) ABSTRACT

Redundant circuits 11 to 15 are provided in correspondence to memory blocks 1 to 5, respectively. Bit lines BL0 to BL15 are located across the memory blocks. Spare bit lines SBL1 and SBL2 are located across the redundant circuits 11 to 15. When a memory cell failure occurs in the memory block 5 except a predetermined memory block (for example, a boot block) 2 and when the bit line BL8 corresponding to the memory cell failure is replaced with the spare bit line SBL1, each of switches 56 and 76 is put into an on state in correspondence to the spare bit line SBL1. Furthermore, each of switches 48 and 88 is put into the on state in correspondence to the bit line BL8. As a result, the spare bit line SBL1 turns the redundant circuit 12 corresponding to the memory block 2, to be connected to the memory block 2.

3 Claims, 10 Drawing Sheets

FLASH MEMORY HAVING ENHANCED YIELD AND HAVING ENHANCED RELIABILITY IN REDUNDANT AND DUMMY CIRCUITS

BACKGROUND OF THE INVENTION

1. Field of the Invention

The present invention relates to a flash memory having redundant circuits, and more particularly, to a flash memory capable of improving yields.

2. Description of the Prior Art

FIG. 13 is a configuration for illustrating a conventional flash memory device. In FIG. 13, reference numerals 1 to 5 represent memory blocks, respectively. Reference numerals 11 to 15 represent redundant circuits (redundant memory blocks), respectively. The redundant circuits 11 to 15 are positioned adjacent to the memory blocks 1 to 5, respectively. In the flash memory device being illustrated, bit lines BL0 to BL15 are located across the memory blocks 1 to 5. In addition, spare bit lines SBL1 and SBL2 are located across the redundant circuits 11 to 15. For example, when a memory cell 8 is at fault in the memory block 5 in the flash memory device being illustrated, the memory cell 8 is replaced with the redundant circuit 15.

By the way, a wafer test 0 (WT0) is carried out in concern to a wafer in order to check whether or not a wafer has a malfunctioned memory cell after a wafer process finishes. More particularly, the WT0 is for checking whether or not the flash memory device has the malfunctioned memory cell. When the flash memory device has the malfunctioned memory cell, the location of the malfunctioned memory cell is stored which may be a malfunctioned memory cell 8 in FIG. 13. By laser trimming and so on, saving information is produced which is for use in replacing the bit line BL8 with the spare bit line SBL1 of the redundant circuits 11 to 15. The malfunctioned memory cell 8 is positioned at the bit line BL8.

After the above-mentioned WT0 is completed, the bit line BL8 having the malfunctioned memory cell 8 is replaced with spare bit line SBL1 of the redundant circuits 11 to 15 by the laser trimming on the basis of the remedy or saving information. A wafer test 1 (WT1) is carried out which is for testing the flash memory device in addition to the spare bit line SBL1 of the redundant circuits 11 to 15. When the flash memory device passes the test, the flash memory device is conveyed to a next process.

FIG. 14 shows a view for illustrating a structure of the memory cell. Reference numeral 101 represents a control gate (CG). A predetermined voltage is applied to the control gate 101 on carrying out a writing/erasing operation. Reference numeral 102 represents a floating gate. The floating gate 102 traps electrons on the basis of the writing/erasing operation. Reference numeral 103 represents an insulating film having an ONO structure. Reference numeral 104 represents a tunnel oxide film through which the electrons travel between the floating gate 102 and a base 105 in accordance with tunnel phenomenon.

In FIG. 14, +10V may be, for example, applied to the control gate 101 and 0V may be applied to the base 105 in case of setting a threshold voltage Vth of the memory cell to a high voltage, on the writing/erasing operation. On the other hand, −10V may be applied to control gate 101 and +10V is applied to the base 105 in case of setting the threshold voltage Vth of the memory cell to a low voltage.

As described above, the voltage of 20V is applied between the control gate 101 and the base 105 in case of setting the threshold voltage Vth of the memory cell to the low voltage. As a result, an electrical breakdown often occurs in each of the tunnel oxide film 104 and the ONO insulating film 103 when the memory cell has a defect or a foreign particle.

There is the breakdown of the insulating film and so on which are based on applying the high voltage to the tunnel oxide film 104 and the ONO insulating film 103, as a memory cell destruction mode on the wafer test. In the above-mentioned WT0 and WT1, the malfunctioned memory cell is removed which is based on the breakdown of the insulating film.

In general, the writing/erasing operations are repeated in concern to the memory blocks 1 to 5 at the WT0 and the WT1, in order to carry out the sufficient testing of the memory blocks 1 to 5. On the other hand, a minimum testing is carried out in concern to the redundant circuits 11 to 15 on the WT0, taking the testing time and the testing cost into consideration, inasmuch as there are some questions as to whether or not each of the redundant circuits 11 to 15 is actually used. For example, only one reading/writing operation is carried out in concern to the redundant circuits 11 to 15, in order to check whether or not data are correctly written in the each of the redundant circuits 11 to 15.

Under the circumstances, the probability of discovery of the malfunctioned memory cell is very high in concern to each of the memory blocks 1 to 5. It is often difficult to discover the malfunctioned memory cell and to remove the malfunctioned memory cell in concern to each of the redundant circuits 11 to 15.

As described above, there is a problem in a case where it is impossible to remove the malfunctioned memory cell in the WT0 even if any one of the redundant circuits has the malfunctioned memory cell. In other words, it is impossible to use the part corresponding to the memory cell of the memory block 2 that is positioned on the bit line BL8, when an error or destruction occurs in the memory cell (for example, the memory cell 9 of the redundant circuit 12) positioned on the spare bit line SBL1 of the replaced redundant circuit in the middle of repeating the writing/erasing operation in the next WT1. As a result, there is a problem in which the flash memory becomes an inferior product.

More particularly, it is necessary to carry out a serious testing inasmuch as the number of the writing/erasing operations inevitably increases, when the memory block is a boot memory block in which accessing frequencies are very high. When there is the malfunctioned memory cell in the redundant circuit 12 which corresponds to the boot memory block 2 after the malfunctioned memory cell of the boot memory block 2 is replaced with the redundant circuit in the WT0, there is a problem in which it is impossible to use the flash memory device although the malfunctioned memory cell of the boot memory block 2 has a very small memory area in comparison to the entire memory area of the flash memory device.

In addition, a potentially malfunctioned memory cell may be included in each of the redundant circuits inasmuch as the testing is not perfectly carried out in concern to each of the redundant circuits through the WT0 and the WT1. There is a problem in which the potentially malfunctioned memory cell becomes an actually malfunctioned memory cell when the flash memory device is under an actual use.

In a case where the malfunctioned memory cell is replaced with the redundant circuit (spare memory cell) in the manner described above, the replaced memory cell is destroyed on the basis of a great number of rewriting operations so that the word line concerned to the replaced memory cell becomes at fault. As a result, the flash memory device becomes at fault. In this event, it is necessary for the memory block to have no potentially malfunctioned memory cell in case where a great number of rewriting operations are carried out in concern to the memory block.

In addition, dummy bit lines may be positioned at both sides of each memory cell in the flash memory device, in order to make a work shape become stable in the wafer process. A memory cell exists on each of the dummy bit line which is connected to the memory cell of the memory block and the memory cell (spare memory cell) of the redundant circuit.

In this case, it is impossible to carry out testing of dummy bit lines through the WT0 and WT1. For example, when the dummy bit line corresponding to the boot memory block is destroyed on the basis of a great number of rewriting operations, the word line concerned to the memory cell of the dummy bit line becomes at fault. As a result, the flash memory device may be at fault. Under the circumstances, it is also necessary for the memory block to have no potentially malfunctioned memory cell in the dummy bit line in order to ensure the memory block to carry out a great number of rewriting operations. However, there is a problem in which quality assurance is difficult inasmuch as it is impossible to carry out the testing of each of dummy bit lines in the WT0 and WT1.

SUMMARY OF THE INVENTION

In order to dissolve the above-mentioned problems, it is an object of this invention to provide a flash memory device capable of preventing reduction of the yield that is based on a memory cell failure of a redundant circuit.

In addition, it is another object of this invention to provide a flash memory device capable of preventing occurrence of failure that is based on a potentially malfunctioned memory cell of a redundant circuit, in an actual use.

Furthermore, it is still another object of this invention to provide a flash memory device capable of preventing occurrence of failure that is based on a potentially malfunctioned memory cell positioned on a dummy bit line, in an actual use.

A flash memory device according to this invention comprises a plurality of memory blocks and redundant circuits corresponding to said memory blocks, respectively. The flash memory device further comprises replacing means for carrying out replacement by remaining redundant circuits except a particular one of the redundant circuits that corresponds to at least predetermined one of the memory blocks, when a memory cell failure occurs in at least one of the remaining memory blocks except the predetermined memory block.

In a flash memory device according to this invention, bit lines are located across the memory blocks and spare bit lines are located across the redundant circuits. The replacing means makes a specific one of the spare bit lines turn the particular redundant circuit to connect the specific spare bit line to the predetermined memory block when the memory cell failure occurs in at least one of the remaining memory blocks and when the bit line corresponding to the memory cell failure is replaced with the specific spare bit line.

In a flash memory device according to this invention, the predetermined memory block is a memory block which has highest access frequencies among the memory blocks.

In a flash memory device according to this invention, the predetermined memory block is a memory block which has a least memory capacity among the memory blocks.

A flash memory device according to this invention comprises a plurality of memory blocks and redundant circuits corresponding remaining memory blocks, respectively, except at least predetermined one of said memory blocks. The flash memory device further comprises bit lines located across said memory blocks, spare bit lines located across said redundant circuits, and means for connecting the predetermined memory block to a specific one of the spare bit lines when a memory cell failure occurs in at least one of the remaining memory blocks so that the bit line corresponding to the memory cell failure is replaced with the specific spare bit line.

In a flash memory device according to this invention, a word line is located along each pair of the memory block and the redundant circuit. The word line located along the predetermined memory block is disconnected between the predetermined memory block and the particular redundant circuit. A predetermined voltage is applied to the word line located along the predetermined memory block, at a side of the particular redundant circuit.

In a flash memory device according to this invention, a word line is located along to each pair of the memory block and the redundant circuit. The word line located along the predetermined memory block is disconnected between the predetermined memory block and the particular redundant circuit. The word line located along the predetermined memory block is put into a floating state at a side of the particular redundant circuit.

In a flash memory device according to this invention, a word line is located along each pair of the memory block and the redundant circuit. Well are formed in each of the predetermined memory block and the particular redundant circuit to be independent of each other. A predetermined voltage is applied to the well formed in the particular redundant circuit.

In a flash memory device according to this invention, each of the memory blocks and the redundant circuits has a memory cell. The memory cell of the particular redundant circuit has no floating gate.

A flash memory device according to this invention comprises a plurality of memory blocks and dummy cells corresponding to the memory blocks, respectively. A word line is located along each pair of the memory block and the dummy cell. A selected word line located along a selected memory block is selectively disconnected between the memory block and the dummy cell. A predetermined voltage is applied to the word line at a side of the dummy cell for the word line disconnected between the memory block and the dummy cell.

A flash memory device according to this invention comprises a plurality of memory blocks and dummy cells corresponding to the memory blocks, respectively. A word line is located along to each pair of the memory block and the dummy cell. The word line located along each of the memory blocks is selectively disconnected between the memory block and the dummy cell. The word line is put into a floating state at a side of the dummy cell when the word line is disconnected between the memory block and the dummy cell.

A flash memory device according to this invention comprises a plurality of memory blocks and dummy cells corresponding to the memory blocks, respectively. A word line is located along each pair of the memory block and the redundant circuit. Wells are selectively formed in each pair of the predetermined memory block and the dummy cell so as to be independent of each other. A predetermined voltage is applied to the well formed in the dummy cell.

DETAILED DESCRIPTION OF THE PREFERRED EMBODIMENTS

An embodiment of the present invention will be described below.

Embodiment 1

Figure 1:
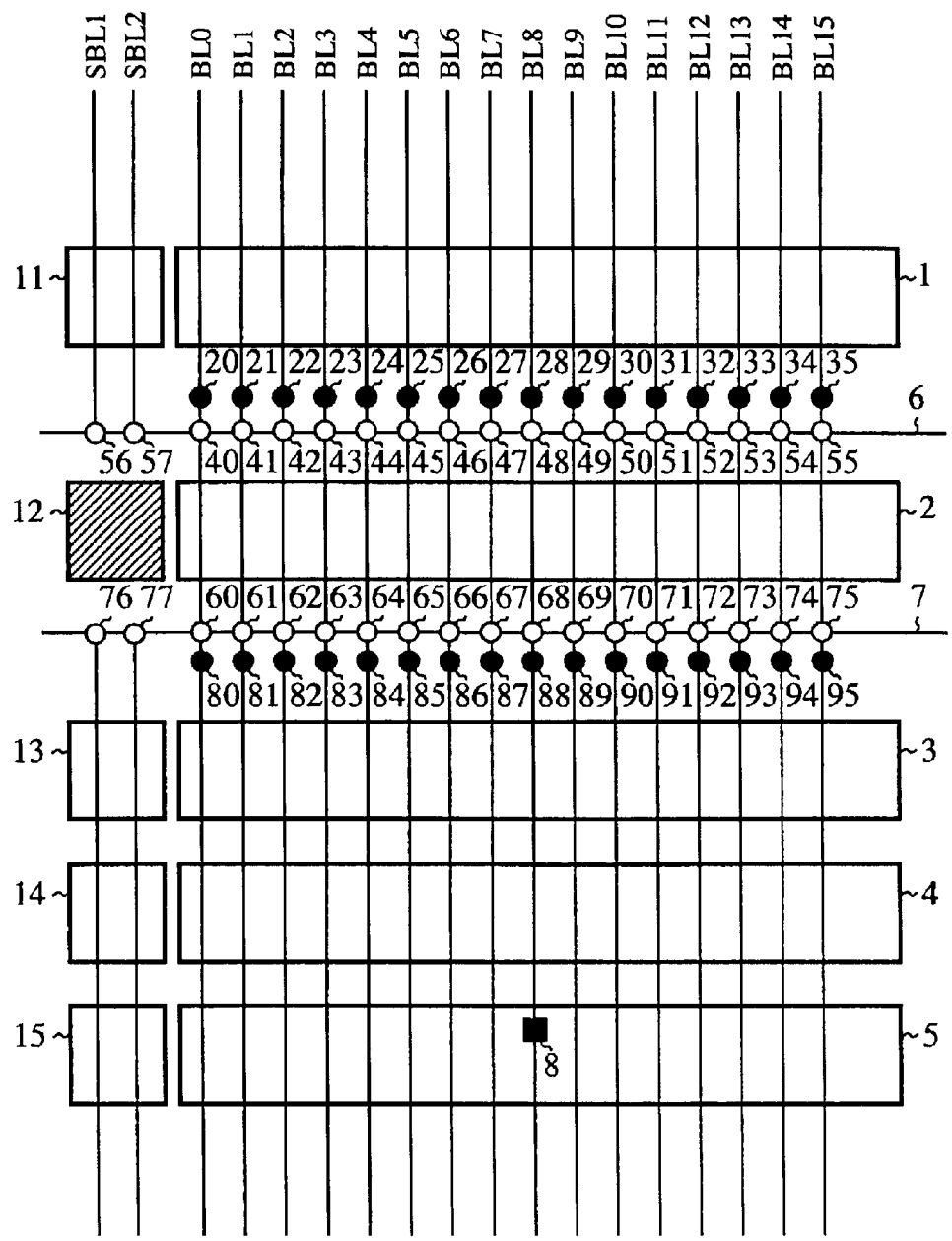
FIG. 1 is a configuration for illustrating a flash memory device according to a first embodiment of this invention.

In FIG. 1, reference numerals 1 to 5 each represent a memory block, which has arranged flash memory cells (hereinafter, referred to as simply 'memory cell'). Reference numerals 11 to 15 each represent a redundant circuit. Each of the redundant circuits 11 to 15 has memory cells to be adapted for replacement, when a memory cell failure occurs in at least one of the memory blocks 1 to 5. In the example illustrated in FIG. 1, the memory block 2 is a boot block. The redundant circuit 12 is a redundant circuit for the boot block 2. Bit lines BL0 to BL15 are located across the memory blocks 1 to 5. Spare bit lines SBL1 and SBL2 are located across the redundant circuits 11 to 15.

Auxiliary lines 6 and 7 extend along the memory block 2 and the redundant circuit 12 across the bit lines BL0 to BL15 and the spare bit lines SBL0 and SBL1. Between the memory block 1 and the memory block 2, switches 20 to 35 are positioned at the bit lines BL0 to BL15, respectively. Similarly, switches 80 to 95 are positioned at the bit lines BL0 to BL 15 between the memory block 2 and the memory block 3, respectively. As described later, the bit lines BL0 to BL15 are connected to the memory block 2 by the switches 20 to 35 and the switches 80 to 95.

Switches 40 to 55 are positioned at points of intersections of the auxiliary line 6 and the bit lines BL0 to BL15, respectively. Switches 56 and 57 are positioned at points of intersections of the auxiliary line 6 and the spare bit lines SBL1 and SBL2, respectively. Similarly, switches 60 to 75 are positioned at points of intersections of the auxiliary line 7 and the bit lines BL0 to BL15, respectively. Switches 76 and 77 are positioned at points of intersections of the auxiliary line 7 and the spare bit lines SBL1 and SBL2, respectively. As will be described later, the spare bit lines SBL1 and SBL2 are connected to the bit lines BL0 to BL15 through the auxiliary line 6 in concern to the memory block 2, by the switches 40 to 57. In addition, the spare bit lines SBL1 and SBL2 are connected to the bit lines BL0 to BL15 through the auxiliary line 7 with respect to the memory block 2, by the switches 60 to 77.

Each of the above-mentioned switches 20 to 35, 40 to 57, 60 to 77, and 80 to 95 may be, for example, a transistor. When a high level (H) is supplied to a gate of the transistor through a control signal line, the transistor becomes ON state between source and drain. When a low level (L) is supplied to the transistor through the control signal line, the transistor becomes OFF state between the source and the drain. In FIG. 1, the switch is depicted by a black circle mark when the switch is ON state. When the switch is OFF state, the switch is depicted by a white circle mark.

Next, the description will proceed to an operation of the flash memory device illustrated in FIG. 1.

In FIG. 1, each of the switches 20 to 35 and the switches 80 to 95 is put into ON state and each of the switches 40 to 57 and the switches 60 to 77 is put into OFF state, before any one of the bit lines BL0 to BL15 is replaced with the spare bit line SBL1 or SBL2. As a result, the bit lines BL0 to BL15 are connected to the memory blocks 1 and 3 to 5 through the memory block (boot block) 2.

Now, it will be assumed that a malfunctioned memory cell 8 is found out in the memory block 5 in the wafer test 0 (WT0). The bit line BL8 is replaced with the spare bit line SBL1. In this event, the memory cell corresponding to the bit line BL8 is not replaced with the memory cell of the redundant circuit 12 in the boot block 2, inasmuch as the memory block 2 is the boot block. In other words, the redundant circuit 12 does not have a replaced memory cell.

Inasmuch as the memory block 5 has the malfunctioned memory cell 8, each of the switches 28 and 88 is put into OFF state and each of the switches 48, 56, 68, and 76 is put into ON state, from the above-mentioned state. In other words, each of the switches 20 to 27, 29 to 35, 80 to 87, 89 to 95, 48, 56, 68, and 76 is put into ON state. Each of the switches 40 to 47, 49 to 55, 60 to 67, 69 to 75, 28, 57, 77, and 88 is put into OFF state. Therefore, the spare bit line SBL1 is connected to the auxiliary line 6 by the switch 56 on displacing the bit line BL8 with the spare bit line SBL1, inasmuch as the switch 56 is put into ON state. Furthermore, the auxiliary line 6 is connected to the bit line BL8 by the switch 48 inasmuch as the switch 48 is put into ON state. The bit line BL8 is connected to the auxiliary line 7 by the switch 68. In addition, the auxiliary line 7 is connected to the spare bit line SBL1 by the switch 76. In other words, the spare bit line SBL1 detours or turns the redundant circuit 12 to be connected to the memory block 2 through the auxiliary lines 6 and 7 (the memory cell of the memory block 2 is not replaced with the memory cell of the redundant circuit 12).

Although the above description is made about a case where the malfunctioned memory cell 8 exists in the memory block 5, the switches is controlled in accordance with saving information (location information representative of a location of the malfunctioned memory cell) which is obtained by the WT0.

As readily understood from the above description, the switches 20 to 35, 40 to 57, 60 to 77, and 80 to 95 and the auxiliary lines 6, 7 collectively serve as a replacing means.

As described above, the boot block 2 is not replaced with the redundant circuit 12 even if the memory cell failure occurs in one of the remaining memory blocks except the boot block. Even if the writing/erasing operations are repeated to the boot block in a case where the potentially malfunctioned memory cell is not found out in the redundant circuit in the WT0 in which a minimum testing is carried out with respect to the redundant circuit, destruction does not occur in the redundant circuit-because the boot block is not replaced with the redundant circuit. Accordingly, memory cell destruction does not occur in the redundant circuit corresponding to the boot block, in the WT1. It is possible to improve the yield of the flash memory device. In other words, the yield does not reduce by reason of the memory cell failure of the redundant circuit corresponding to the boot block even though the writing/erasing operations are repeated with respect to the boot block, inasmuch as the boot block is not replaced with the redundant circuit in case where the memory cell failure occurs in one of the remaining memory block except the boot block.

Incidentally, a cost loss appears minimal in comparison to the cost loss on testing in a case where the memory cell failure is found out in the boot block on the WT1, although it is impossible to replace the boot block with the redundant circuit in a case where the memory cell failure occurs in the boot block. Even if it is impossible to replace the boot block with the redundant circuit, the loss appears minimal in comparison to reduction of the yield that is based on occurrence of the memory cell failure of the redundant circuit.

Although the memory block such as the boot block which has the highest access frequencies is not replaced with the redundant circuit even if the memory cell failure is found out in one of the remaining memory blocks, in the first embodiment, replacement may be determined on the basis of a size or a memory capacity of each memory block instead of the accessing frequencies. More particularly, it will be assumed that the memory block 1 has the capacity of 16 k bytes and the memory block 2 has the capacity of 4 k bytes in FIG. 1. Furthermore, it will be assumed that each of the memory blocks 3 to 5 has the capacity of 64 k bytes. The memory block 2 has a minimum probability of occurrence of the memory cell failure. Therefore, the memory block 2 is not replaced with the redundant circuit even if the memory cell failure occurs in one of the remaining memory blocks.

As described above, the memory block having the minimum probability of occurrence of the memory cell failure is not replaced with the redundant circuit even though the memory cell failure occurs in one of the remaining memory blocks. Inasmuch as the memory block has the minimum probability of occurrence of the memory cell failure, it is possible to reduce a probability in which the memory block cannot be replaced with the redundant circuit, in case where the memory cell failure occurs in the memory block.

In addition, the flash memory device may not have the redundant circuit 12 corresponding to the boot block 2 or the memory block of the minimum capacity, in FIG. 1. In other words, the redundant circuit 12 is not formed in the flash memory device in concern to the boot block or the memory block of the minimum capacity on carrying out a layout of the flash memory device, inasmuch as the redundant circuit 12 is not used.

As described above, it is possible to reduce a memory size of the flash memory device when the flash memory device is designed without the redundant circuit 12 on the layout of the flash memory device.

Embodiment 2

Figure 2:
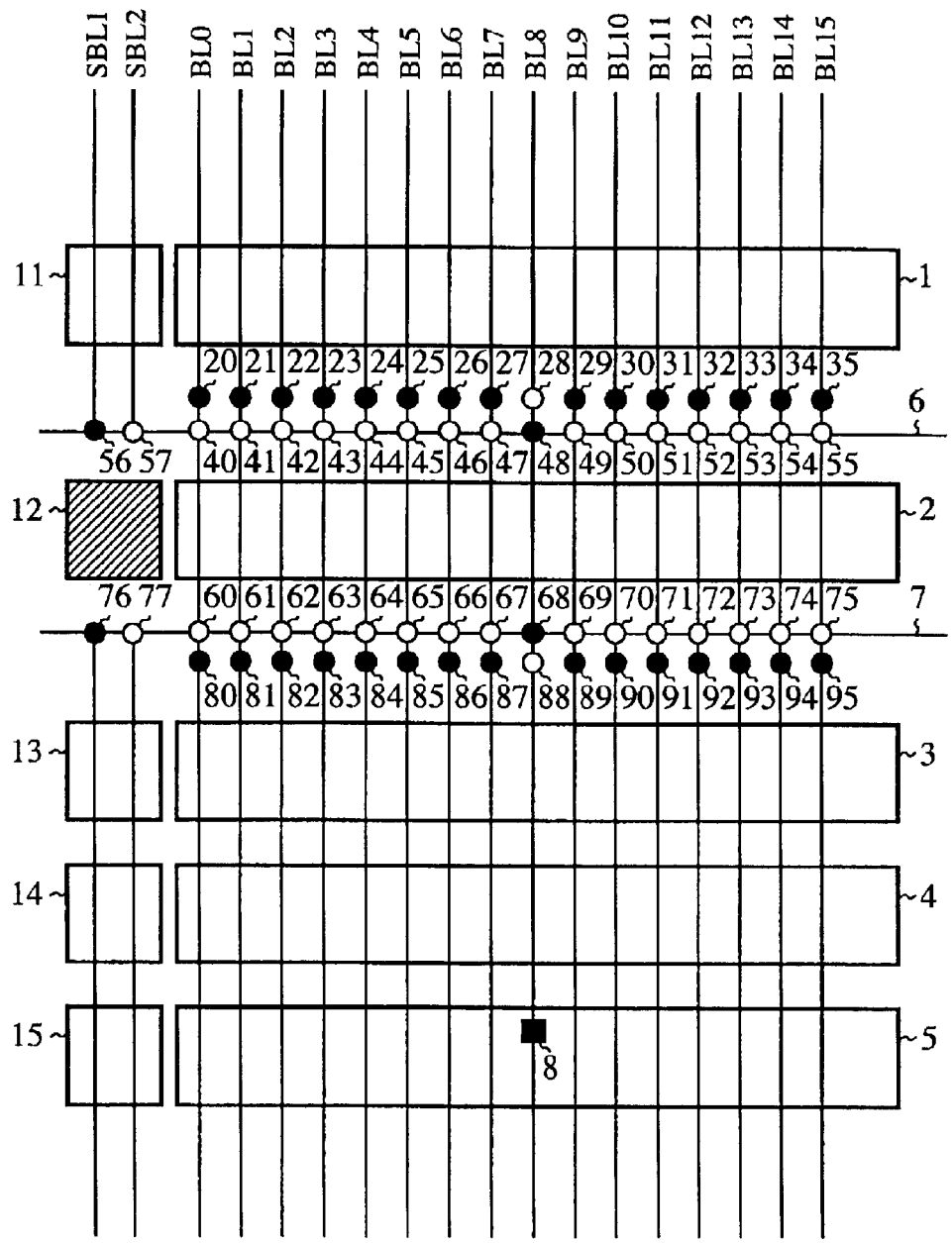
FIG. 2 shows a view of the flash memory device after carrying out replacement by redundant circuits in FIG. 1.
Figure 3:
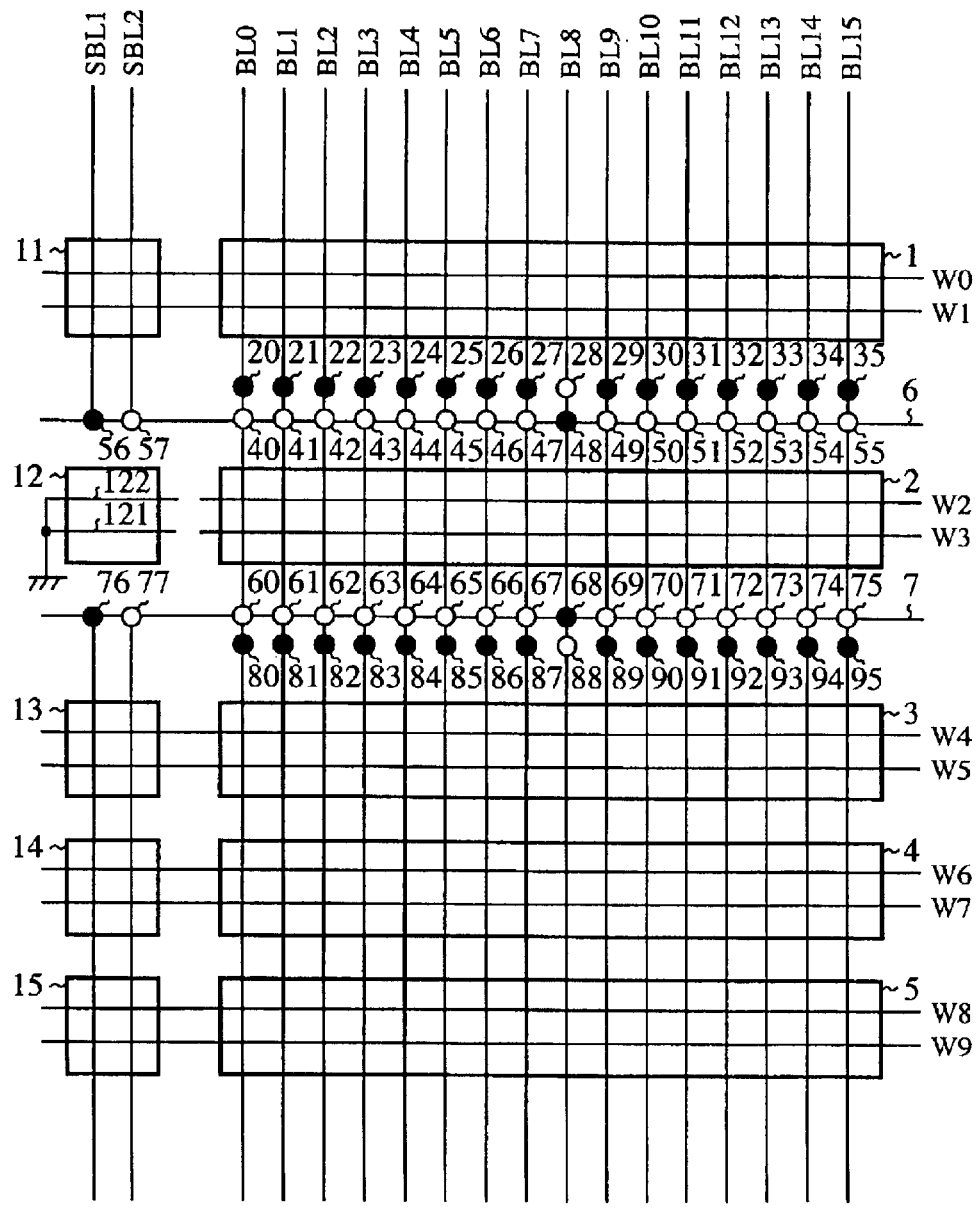
FIG. 3 is a configuration for illustrating a flash memory device according to a second embodiment of this invention.

In FIG. 3, W0 to W9 represent word lines, respectively. Incidentally, the flash memory device illustrated in FIG. 3 comprises similar parts which are designated by the like reference numerals of FIG. 2. In FIG. 3, the word lines W2 and W3 are cut off between the redundant circuit 12 and the memory block 2 such as the boot block. The word lines existing along the redundant circuit 12 are designated by reference numerals 121 and 122, respectively. The word lines 121 and 122 are connected to the ground.

In FIG. 3, each of the switches 20 to 27, 29 to 35, 80 to 87, 89 to 95, 48, 56, 68, and 76 is put into ON state. Each of the switches 40 to 47, 49 to 55, 60 to 67, 69 to 75, 28, 57, 77, and 88 is put into OFF state. As a result, the spare bit line SBL1 is connected auxiliary line 6 by the switch 56. Furthermore, the auxiliary line 6 is connected to the bit line BL8 by the switch 48. The bit line BL8 is connected to the auxiliary line 7 by the switch 68. The auxiliary line 7 is connected to the spare bit line SBL1 by the switch 76. In other words, the spare bit line SBL1 turns the redundant circuit 12 to be connected to the memory block 2 through the auxiliary lines 6 and 7. As described above, the word lines 121 and 122 is connected to the ground. In the redundant circuit 12, a ground potential is applied to the word lines 121 and 122.

Next, the description will proceed to an operation of the flash memory device illustrated in FIG. 3.

Figure 4:
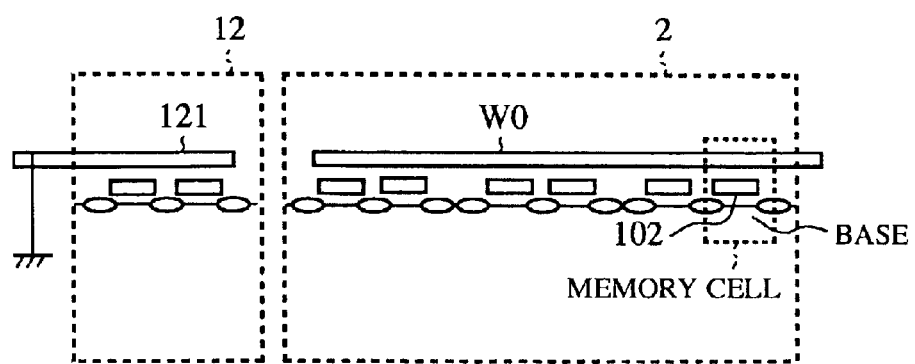
FIG. 4 shows a sectional view of the flash memory device illustrated in FIG. 3.
Figure 14:
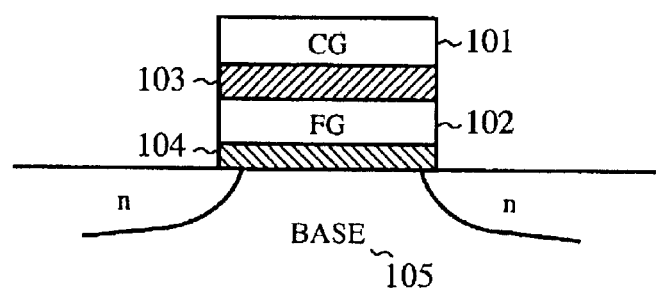
FIG. 14 shows a sectional view for illustrating a flash memory cell.
Figure 13:
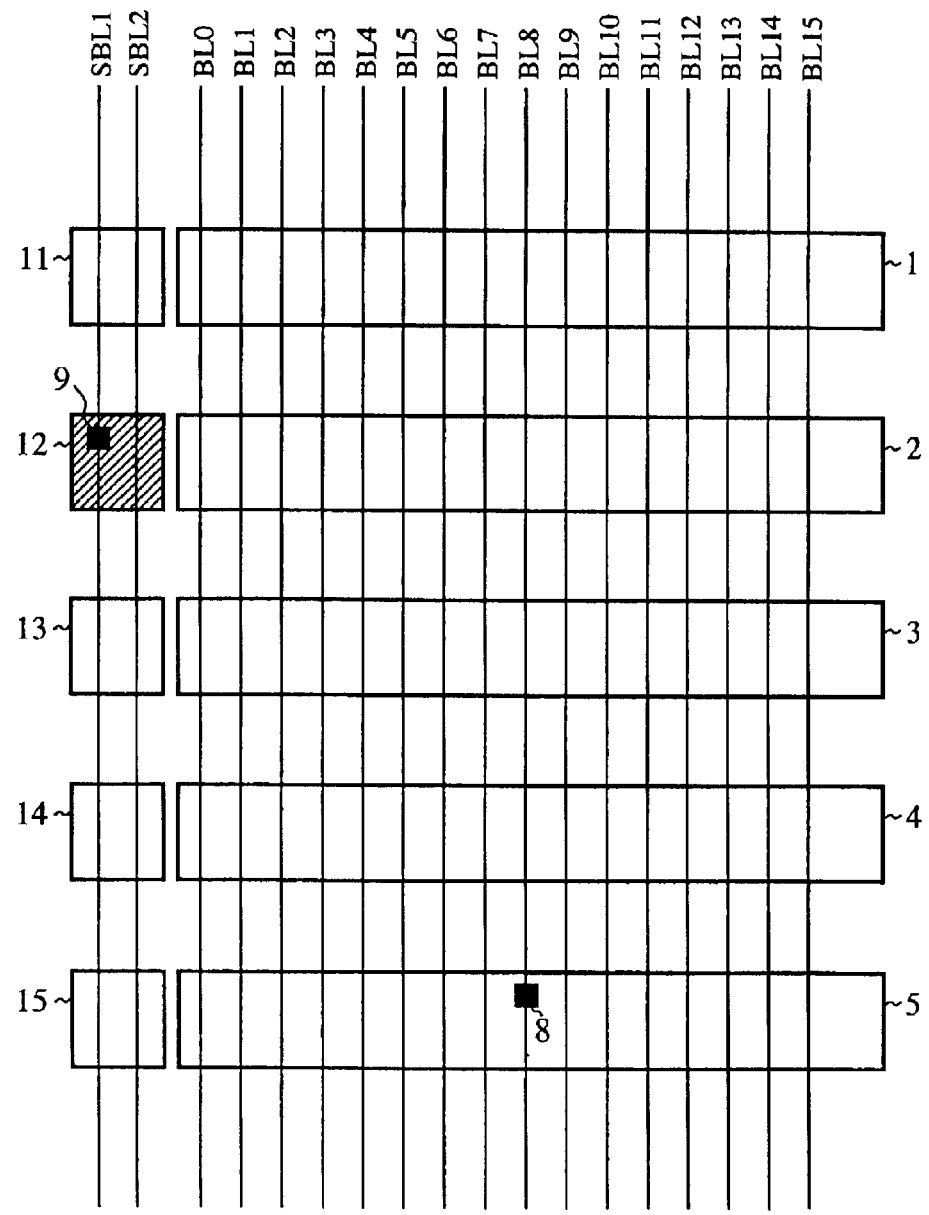
FIG. 13 is a configuration for illustrating a conventional flash memory device.

Referring to FIGS. 3 and 4, +10V is applied to the control gate illustrated in FIG. 14 and 0V is applied to the base in case of setting a threshold voltage (Vth) of the memory cell to a high voltage, on carrying out the writing/erasing operation for the memory cell. On the other hand, −10V is applied to control gate and +10V is applied to the base in case of setting the threshold voltage Vth of the memory cell to a low voltage. In case of setting the threshold voltage Vth of the memory cell to the low voltage, the voltage of 20V is applied to each of the memory cells in the memory block 2. Inasmuch as the word lines 121 and 122 are disconnected from the word lines W2 and W3 to be connected to the ground potential in the redundant circuit 12, the voltage of 10V is merely applied to each of the memory cells in the redundant circuit 12.

As described above, the voltage of 0V is always applied to the control gate of the memory cell in the redundant circuit 12 on rewriting data, according to the second embodiment, inasmuch as the word lines 121 and 122 are disconnected from the word lines W2 and W3 to be connected to the ground potential. Therefore, the voltage of 10V is applied in maximum to each of the insulating film 103 and oxide film 104 illustrated in FIG. 14. In other words, the voltage applied to the insulating film 103 and oxide film 104 becomes half in the second embodiment when compared to the conventional flash memory device. As a result, destruction hardly occurs in the memory cell of the redundant circuit 12.

Embodiment 3

Figure 5:
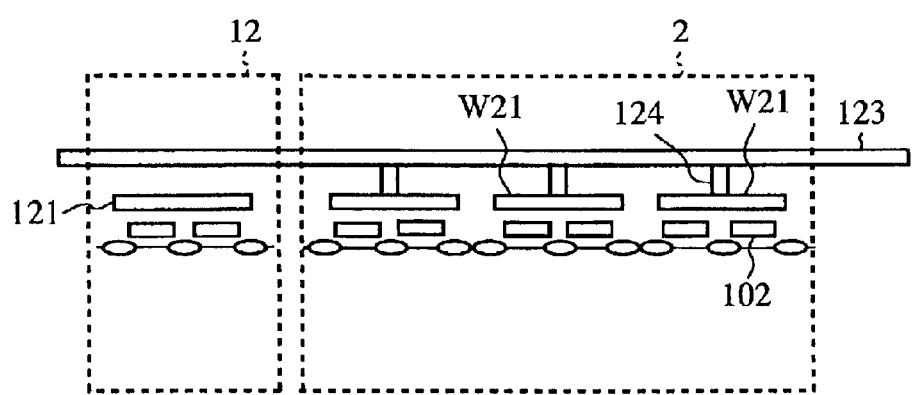
FIG. 5 shows a sectional view for illustrating a flash memory device according to a third embodiment of this invention.

In FIG. 5, the word line W2 is divided into a plurality of word line portions W21 in the memory block 2. Incidentally, the word lines W2 and W3 are cut off in the memory block 2 so that the word lines W2 and W3 are disconnected from the redundant circuit 12 in a similar manner described in FIG. 3, although illustration is not made in FIG. 5.

A word line pile 123 extends over the memory block 2 and the redundant circuit 12. The above-mentioned word line portions W21 are connected to the word line pile 123 through via hole 124, respectively. In other words, the word line portions W21 are connected to one another through the word line pile 123 and the via holes 124. On a memory accessing, a predetermined voltage is applied to the word line portion W21. As shown in FIG. 5, the word line 121 is not connected to the word line pile 123 in the redundant circuit 12. As a result, the word line 121 becomes a floating state.

In the above-mentioned structure, the high voltage is not applied to the control gate of the memory cell in the redundant circuit 12 on rewriting data, inasmuch as the word line 121 is put into the floating state. Accordingly, destruction hardly occurs in the memory cell of the redundant circuit 12 because the voltage reduces which is applied to the insulating film 103 and the oxide film 104 (FIG. 14) of the memory cell.

Embodiment 4

Figure 6:
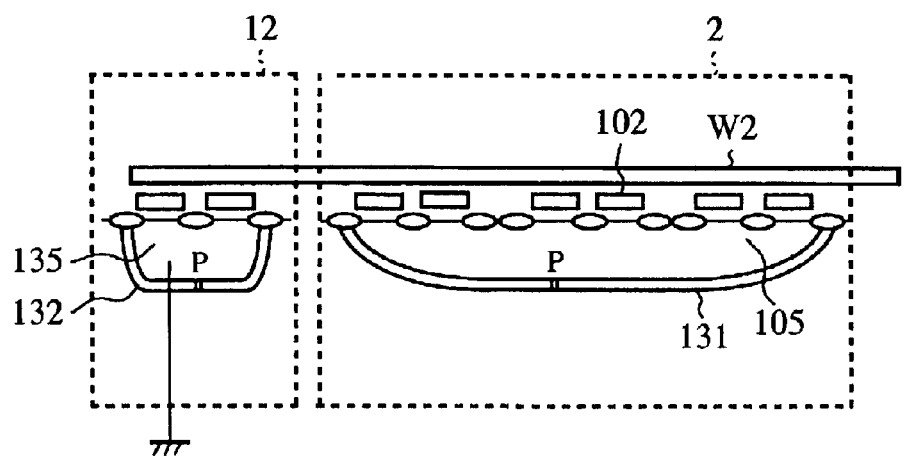
FIG. 6 shows a sectional view for illustrating a flash memory device according to a fourth embodiment of this invention.

In FIG. 6, a memory block well 131 is formed in the memory block 2. In addition, a redundant circuit well 132 is formed in the redundant circuit 12. In the other words, the memory block well 131 and the redundant circuit well 132 are formed in the memory block 2 and the redundant circuit 12, respectively, so as to be independent of each other. The redundant circuit well 132 is connected to the ground (the voltage of 0V is applied to the redundant circuit well 132). As a result, the voltage of 0V is always applied to the base 135 of the memory cell in the redundant circuit 12. On the other hand, a predetermined voltage is applied to the memory block well 131 in the memory block 2 on the memory accessing.

The above-mentioned structure has the memory block well 131 and the redundant circuit well 132 which are independent of each other. The voltage of 0V is applied to the redundant circuit well 132. Accordingly, the voltage of 0V is always applied to the redundant circuit well 132 and the base 135 of the memory cell in the redundant circuit 12. As a result, the voltage of 10V is applied in maximum to each of the insulating film 103 and oxide film 104 (FIG. 14). In other words, the voltage applied to the insulating film 103 and oxide film 104 becomes half in the fourth embodiment when compared to the conventional flash memory device. Destruction hardly occurs in the memory cell of the redundant circuit 12.

Embodiment 5

Figure 7:
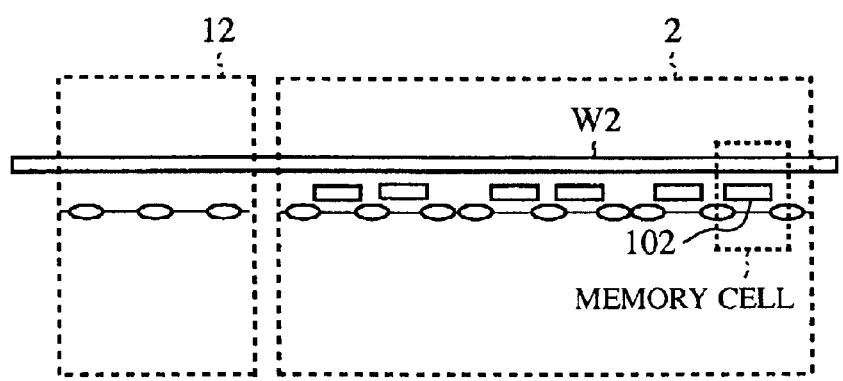
FIG. 7 shows a sectional view for illustrating a flash memory device according to a fifth embodiment of this invention.

In FIG. 7, the memory cell does not have the floating gate (FG) in the redundant circuit 12. When the memory cell does not have the floating gate (FG) in the redundant circuit 12, electrons does not travel between the floating gate and the base in the memory cell. As a result, degradation does not occur in the tunnel oxide film 104 (FIG. 14). It is possible to prevent occurrence of failure that is based on the WT0, the WT1, or a plurality of rewriting operations.

Embodiment 6

Figure 8:
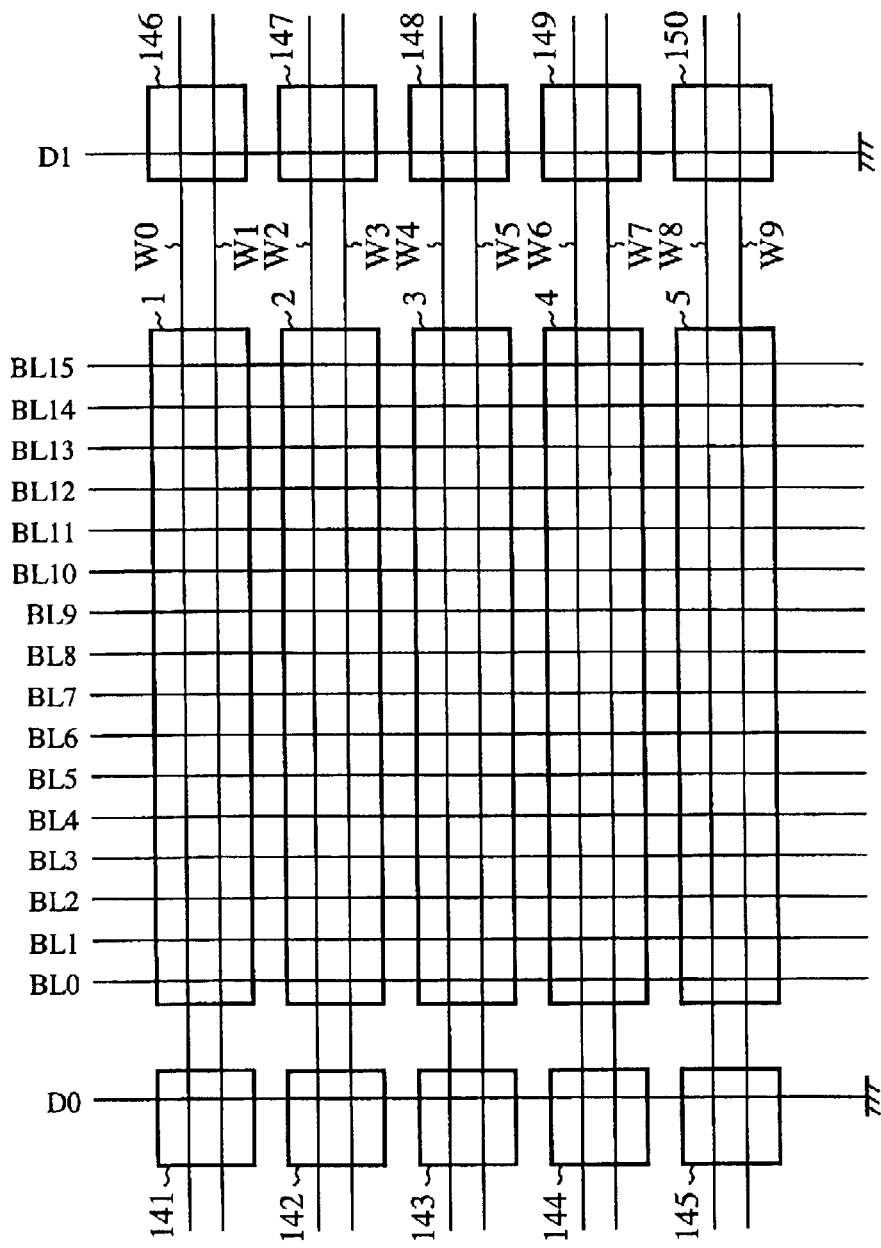
FIG. 8 is a configuration for illustrating a flash memory device having dummy cells.

In the flash memory device, dummy bit lines may be positioned at both sides of the memory block, respectively, in order to stabilize the work shape or form in the wafer process. More particularly, dummy cells 141 to 145 are positioned at sides (left sides in FIG. 8) of the memory blocks 1 to 5, respectively, as shown in FIG. 8. Dummy cells 146 to 150 are positioned at other sides (right sides in FIG. 8) of the memory blocks 1 to 5. A dummy bit line D0 is located across the dummy cells 141 to 145. A dummy bit line D1 is located across the dummy cells 146 to 150. The dummy cells 141 and 146 are connected to the memory cell of the memory block 1 and the memory cell of the redundant circuit 11 which is not illustrated in FIG. 8, through the word lines W0 and W1. Similarly, the dummy cells 142 and 147, the dummy cells 143 and 148, the dummy cells 144 and 149, and the dummy cells 145 and 150 are connected to the memory cells of the memory blocks 2 to 5 and the memory cells of the redundant circuits 12 to 15 through the word lines W2 and W3, the word lines W4 and W5, the word lines W6 and W7, and the word lines W8 and W9, respectively. The dummy bit lines D0 and D1 are connected to the ground. In general, the dummy cells 141 to 150 are not tested in the WT0 and the WT1.

Figure 9:
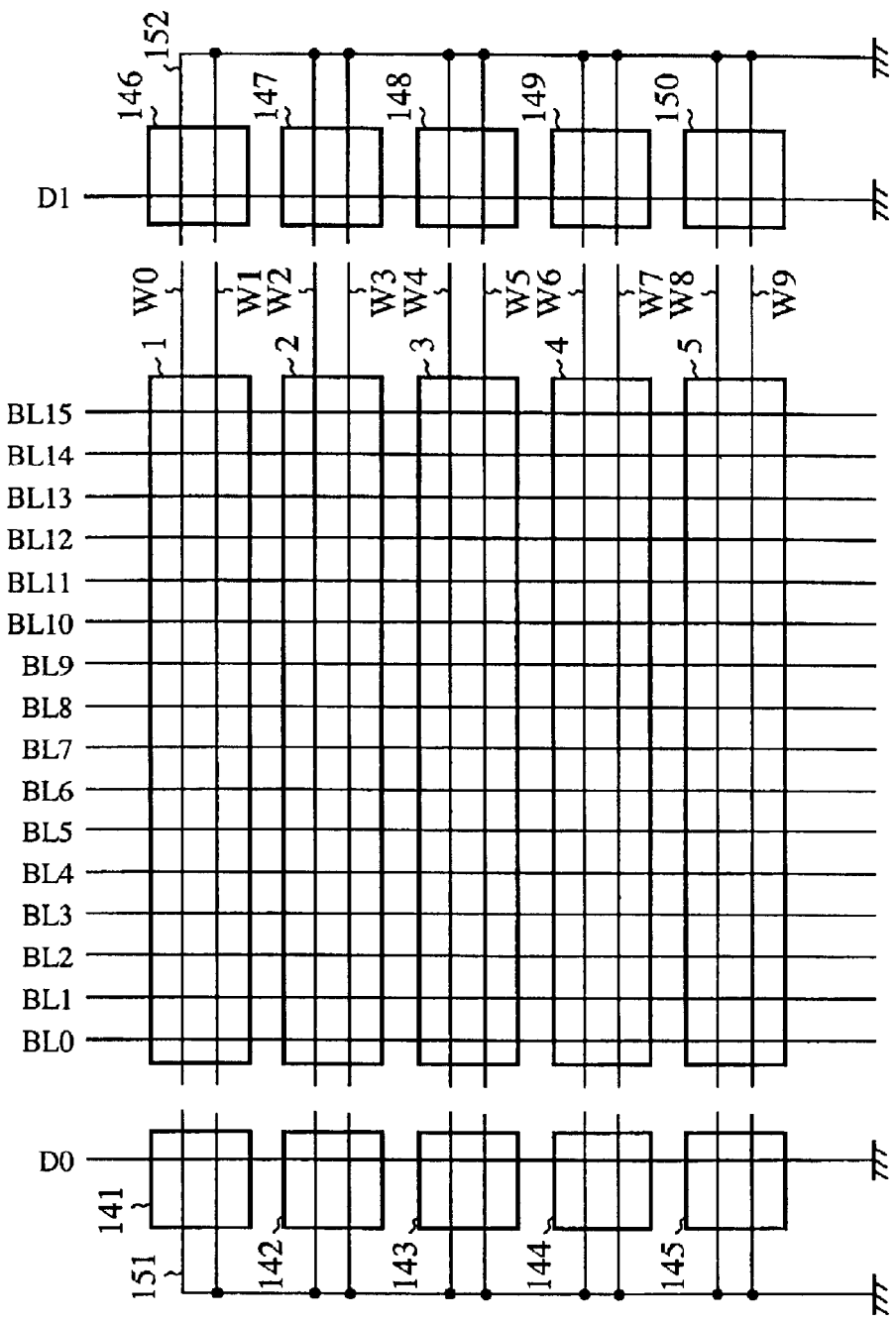
FIG. 9 is a configuration for illustrating a flash memory device according to a sixth embodiment of this invention.

Referring to FIG. 9, the word lines W0 and W1 are cut off to be disconnected from the dummy cells 141 and 146 in the example being illustrated. The word lines existing on the dummy cells 141 and 146 are designated by reference numerals 151 and 152 and will be called dummy word lines, respectively. The dummy word lines 151 and 152 are connected to the ground. Similarly, the word lines W2 and W3, the word lines W4 and W5, the word lines W6 and W7, and the word lines W8 and W9 are cut off to be disconnected from the dummy cells 142 and 147, the dummy cells 143 and 148, the dummy cells 144 and 149, and the dummy cells 145 and 150, respectively. Furthermore, each of word lines (dummy word lines) on dummy cell is connected to the ground.

Next, the description will proceed to an operation of the flash memory illustrated in FIG. 9.

Figure 10:
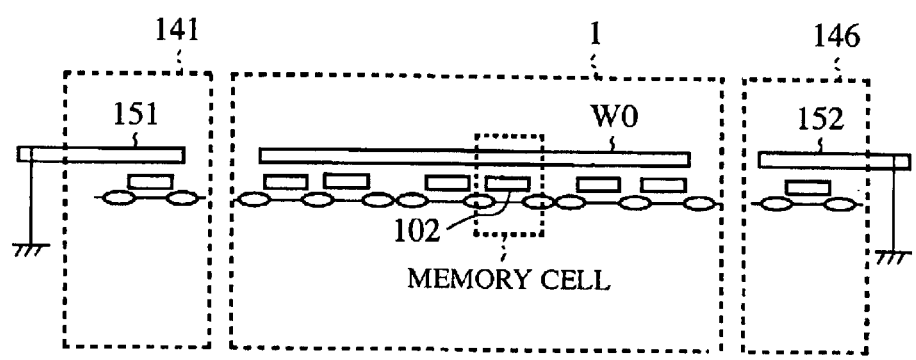
FIG. 10 shows a sectional view of the flash memory device illustrated in FIG. 9.

Referring to FIGS. 9 and 10, attention will be directed to the dummy cells 141 and 146. On carrying out the writing/erasing operation for the memory cell, +10V is applied to the control gate illustrated in FIG. 14 and 0V is applied to the base in case of setting the threshold voltage (Vth) of the memory cell to the high voltage. On the other hand, −10V is applied to control gate and +10V is applied to the base in case of setting the threshold voltage Vth of the memory cell to the low voltage. In case of setting the threshold voltage Vth of the memory cell to the low voltage, the voltage of 20V is applied to each of memory cells in the memory block 1. Inasmuch as the dummy word lines 151 and 152 are disconnected from the word lines W0 and W1 and are connected to the ground potential, the voltage of 10V is only applied to the dummy cells 141 and 146.

Incidentally, the voltage of 10V is applied to each of the remaining dummy cells 142 to 145 and 147 to 150 in a similar manner described above.

As described above, the voltage of 0V is always applied to the control gate of the dummy cell on rewriting data, according to the sixth embodiment, inasmuch as the dummy word lines are disconnected from the word lines W0 to W9, respectively, and are connected to the ground potential. As a result, the voltage of 10V is applied in maximum to each of the insulating film 103 and oxide film 104 illustrated in FIG. 14. In other words, the voltage applied to the insulating film 103 and oxide film 104 becomes half in the sixth embodiment when compared to the conventional flash memory device. Accordingly, destruction hardly occurs in each of the dummy cells.

Although the word lines W0 to W9 are disconnected from the dummy cells 141 to 150 and the dummy word lines are connected to ground in the example being illustrated in FIG. 9, the word line may be disconnected from the dummy cell corresponding to the boot block. The concerned dummy cell is connected to ground in concern to the dummy cell. In other words, the selected word lines are selectively disconnected from dummy cells each of which are connected to ground.

Embodiment 7

Figure 11:
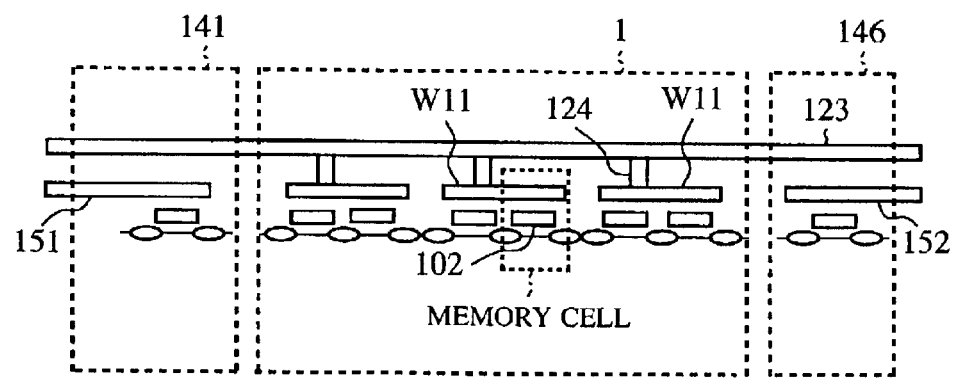
FIG. 11 is a configuration for illustrating a flash memory device according to a seventh embodiment of this invention.

In FIG. 11, the word line W1 is divided into a plurality of word line portions W11 in the memory block 2. Incidentally, the word lines W0 and W1 are cut off in the memory block 1 so that the word lines W0 and W1 are disconnected from the dummy cells 141 and 142 in a similar manner described in FIG. 9, although illustration is not made in FIG. 11.

The word line pile 123 extends over the memory block 1 and the dummy cells 141 and 142. The above-mentioned word line portions W11 are connected to word line pile 123 through the via holes 124. In other words, the word line portions W11 are connected to one another through the word line pile 123 and the via holes 124. On the memory accessing, the predetermined voltage is applied to the word line portions W11. As shown in FIG. 11, the dummy word lines 151 and 152 are not connected to the word line pile 123 in the dummy cells 141 and 146. As a result, each of the dummy word lines 151 and 152 becomes the floating state.

In the above-mentioned structure, the high voltage is not applied to the control gate in each of the dummy cells 141 and 142 on rewriting data, inasmuch as each of the dummy word lines 151 and 152 is put into the floating state. Accordingly, destruction hardly occurs in each of the dummy cells because the voltage reduces which is applied to the insulating film 103 and the oxide film 104 (FIG. 14) of each dummy cell.

Embodiment 8

Figure 12:
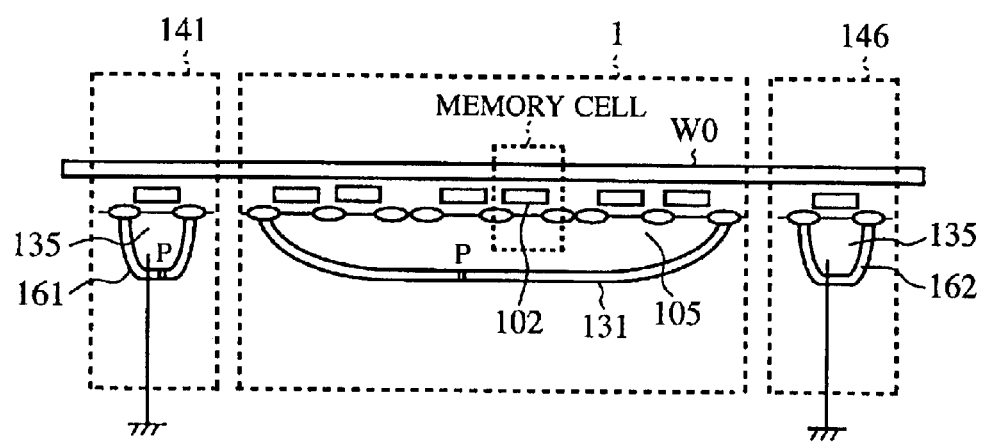
FIG. 12 is a configuration for illustrating a flash memory device according to an eighth embodiment of this invention.

In FIG. 12, the memory block well 131 is formed in the memory block 1. In addition, dummy cell wells 161 and 162 are formed in the dummy cells 141 and 146, respectively. In the other words, the memory block well 131 and the dummy cell wells 161 and 162 are formed in the memory block 1 and the dummy cells 141 and 146, respectively, so as to be independent of each other. Each of the dummy cell wells 161 and 162 is connected to the ground (the voltage of 0V is applied to each of the dummy cell wells 161 and 162). As a result, the voltage of 0V is always applied to the base 135 of the memory cell in each of the dummy cells 141 and 146. On the other hand, the predetermined voltage is applied to the memory block well 131 in the memory block 1 on the memory accessing.

The above-mentioned structure has the memory block well 131 and the dummy cell wells 161 and 162 which are independent of each other. The voltage of 0V is applied to each of the dummy cell wells 161 and 162. Accordingly, the voltage of 0V is always applied to the dummy cell wells 161 and 162 and the base of each dummy cell. As a result, the voltage of 10V is applied in maximum to the insulating film 103 and oxide film 104 (FIG. 14) in each of dummy cells 141 and 146. In other words, the voltage applied to the insulating film 103 and oxide film 104 of each dummy cell becomes half in the eighth embodiment when compared to the conventional flash memory device. Destruction hardly occurs in each dummy cell.

As described above, replacement is carried out by remaining redundant circuits except a particular one of the redundant circuits that corresponds to the predetermined one of the memory blocks, according to this invention, when the memory cell failure occurs in one of the remaining memory blocks except the predetermined memory block. Therefore, replacement is not carried out in concern to the predetermined memory block even though the memory cell failure occurs in one of the remaining memory blocks except the predetermined memory block. It is possible to prevent the yield from reduction by reason of the memory cell failure of the redundant circuit corresponding to the predetermined memory block, even if the writing/erasing operations are repeated in concern to the predetermined memory block.

According to this invention, the redundant circuits are formed in correspondence to the remaining memory blocks except at least predetermined one of the memory blocks. The bit lines are located across the memory blocks and the spare bit lines are located across the redundant circuits. When the memory cell failure occurs in one of the remaining memory blocks and when the bit line corresponding to the memory cell failure is replaced with a specific one of the spare bit lines, the specific spare bit line is connected to the predetermined memory block. In other word, the redundant circuit does not exist which corresponds to the predetermined memory block. Therefore, it is possible to prevent the yield from reduction by reason of the memory cell failure.

According to this invention, the word line located along the predetermined memory block is disconnected between the predetermined memory block and the redundant circuit corresponding to the predetermined memory block. The predetermined voltage is applied to the word line at the side of the redundant circuit corresponding to the predetermined memory block. Destruction hardly occurs in the memory cell.

According to this invention, the word line located along to the predetermined memory block is disconnected between the predetermined memory block and the redundant circuit corresponding to the predetermined memory block. The word line is put into the floating state at the side of the redundant circuit corresponding to the predetermined memory block. Therefore, destruction hardly occurs in the memory cell.

According to this invention, the wells are formed in the predetermined memory block and the redundant circuit corresponding to the predetermined memory block so as to be independent of each other. The predetermined voltage is applied to the well which is formed in the redundant circuit corresponding to the predetermined memory block. Accordingly, destruction hardly occurs in the memory cell.

According to this invention, the redundant circuit corresponding to the predetermined memory block has the memory cell with no floating gate. As a result, destruction hardly occurs in the memory cell.

According to this invention, the word line located along to each memory block is selectively disconnected between the dummy cell and the memory block. The predetermined voltage is applied to the word line at the side of the dummy cell. Therefore, destruction hardly occurs in the dummy cell.

According to this invention, the word line located along to each memory block is selectively disconnected between the dummy cell and the memory block. The word line is put into the floating state at the side of the dummy cell. Therefore, destruction hardly occurs in the dummy cell.

According to this invention, the wells are selectively formed in each pair of the memory block and the dummy cell so as to be independent of each other. The predetermined voltage is applied to the well which is formed in the dummy cell. Accordingly, destruction hardly occurs in the dummy cell.

What is claimed is:

1. A flash memory comprising a plurality of memory blocks and dummy cells corresponding to said memory blocks, respectively, wherein:
   a word line is located along each pair of a memory block and a dummy cell of the plurality of memory blocks and dummy cells;
   a selected word line located along a selected one of the memory blocks is selectively disconnected between the selected memory block and the corresponding dummy cell; and
   a predetermined voltage is applied to the selected word line disconnected between the selected memory block and the corresponding dummy cell at a side of said dummy cell.

2. A flash memory comprising a plurality of memory blocks and dummy cells corresponding to said memory blocks, respectively, wherein:

a word line is located along each pair of a memory block and a dummy cell of the plurality of memory blocks and dummy cells;

a selected word line located along a selected one of the memory blocks is selectively disconnected between the selected memory block and the corresponding dummy cell; and the selected word line disconnected between the selected memory block and the corresponding dummy cell is put into a floating state at a side of said dummy cell.

3. A flash memory according to claim 1, wherein:

wells are selectively formed in said selected memory block and said corresponding dummy cell so as to be independent of each other; and the predetermined voltage is applied to the well formed in said dummy cell.

* * * * *